United States Patent
Chang et al.

(10) Patent No.: US 6,864,434 B2
(45) Date of Patent: Mar. 8, 2005

(54) WARPAGE-PREVENTIVE CIRCUIT BOARD AND METHOD FOR FABRICATING THE SAME

(75) Inventors: Chin-Huang Chang, Taichung (TW); Chin-Tien Chiu, Taichung (TW); Chung-Lun Liu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/441,647

(22) Filed: May 19, 2003

(65) Prior Publication Data

US 2004/0084205 A1 May 6, 2004

(30) Foreign Application Priority Data

Nov. 5, 2002 (TW) ........................................ 91132545 A

(51) Int. Cl.[7] .................................................. H05K 1/03
(52) U.S. Cl. ........................................ 174/255; 174/260
(58) Field of Search ................................ 174/250, 254, 174/255, 260, 256, 267, 268, 261, 262; 361/760, 777, 767; 257/778, 737, 738

(56) References Cited

U.S. PATENT DOCUMENTS

| 6,204,559 B1 | * | 3/2001 | Lin et al. | 257/738 |
| 6,323,438 B1 | * | 11/2001 | Ito | 174/261 |
| 6,380,633 B1 | | 4/2002 | Tsai | |
| 6,476,331 B1 | * | 11/2002 | Kim et al. | 174/261 |
| 6,507,100 B1 | * | 1/2003 | Valluri et al. | 257/697 |

FOREIGN PATENT DOCUMENTS

| JP | 40851258 A | * | 2/1996 |
| JP | 02001326429 A | * | 11/2001 |

* cited by examiner

Primary Examiner—Kamand Cuneo
Assistant Examiner—J B Pate
(74) Attorney, Agent, or Firm—Peter F. Corless; Steven M. Jensen; Edwards & Angell, LLP

(57) ABSTRACT

A warpage-preventive circuit board and method for fabricating the same is provided, wherein a plurality of conductive traces are formed on a surface of an electrically-insulative core layer, and a plurality of discontinuous dummy circuit regions are disposed on the surface of the electrically-insulative core layer at area free of the conductive traces, with adjacent dummy circuit regions being spaced apart by at least a chink. During a high-temperature fabrication process, the dummy circuit regions help reduce thermal stress and the chinks absorb thermal expansion of the dummy circuit regions, to thereby prevent warpage of the circuit board and cracks of a chip mounted on the circuit board, such that yield and reliability of fabricated semiconductor devices can be improved.

4 Claims, 4 Drawing Sheets

WARPAGE-PREVENTIVE CIRCUIT BOARD AND METHOD FOR FABRICATING THE SAME

BACKGROUND OF THE INVENTION

1. Field of the Invention

This invention relates to semiconductor packaging technology and more particularly, to a warpage-preventive circuit board and method for fabricating the same.

2. Description of Related Art

Semiconductor packaging typically utilizes a substrate as chip carrier for the mounting of one or more semiconductor chips thereon allowing the mounted semiconductor chips to be externally connected to an external printed circuit board. For instance, BGA (Ball Grid Array) packaging technology is characterized by the use of a substrate as chip carrier whose front side is used for mounting one or more semiconductor chips and whose back side is provided with a grid array of solder balls. During SMT (Surface Mount Technology) process, the BGA package can be mechanically bonded and electrically coupled to an external printed circuit board (PCB) by means of these solder balls.

FIG. 1A is a schematic diagram showing a top view of the layout of traces on a convention BGA substrate 100. As shown, this substrate 100 is predefined with a die-mounting area (as the area enclosed in the dotted box indicated by the reference numeral 110) and formed with a plurality of electrically-conductive traces 120 within the die-mounting area 110. The areas beyond the electrically-conductive traces 120 are a blank area 130 where no electrical components are mounted. Further, a solder mask 140 is formed over the substrate 100 to cover the electrically-conductive traces 120 and the blank area 130 over the substrate 100, which is used in subsequent solder reflow process as mask against solder.

One drawback to the foregoing substrate 100, however, as illustrated in FIG. 1B, is that the electrically-conductive traces 120 are distributed unevenly over the substrate 100, which would make the electrically-conductive traces 120 easily subjected to thermal stresses during high-temperature processes, undesirably causing the substrate 100 to be subjected to warpage. When the substrate 100 warps, it would affect the die-mounting process, or even cause the mounted chip 150 to crack, resulting in quality issue of the finished BGA package.

U.S. Pat. No. 6,380,633 "PATTERN LAYOUT STRUCTURE IN SUBSTRATE" discloses a solution to the aforementioned problem by providing contiguous dummy circuit regions in the blank area of the substrate FIG. 2 is a schematic diagram showing a top view of the layout of traces on a BGA substrate 200 which is constructed in accordance with the foregoing U.S. patent. As shown, this substrate 200 is predetermined with a die-mounting area 210 and formed with a plurality of electrically-conductive traces 220 within the die-mounting area 210. The blank area beyond the electrically-conductive traces 220 is provided with a contiguous dummy circuit region 230 which is evenly distributed over the substrate 200 so that it can help prevent the electrically-conductive traces 220 to cause the substrate 200 to be subjected to warpage.

One drawback to the foregoing patent, however, is that the dummy circuit region 230 on the substrate 200 is made of copper (Cu) whose CTE (Coefficient of Thermal Expansion) is about 16 ppm☐, whereas the substrate 200 is made of bismaleimide trazine (BT) whose CTE is about 14 ppm☐; and therefore, in the case of the dummy circuit region 230 being unevenly distributed, the substrate 200 would be nevertheless subjected to warpage due to CTE mismatch between the substrate 200 and the dummy circuit region 230 while undergoing high-temperature processes, such as baking, reflow, and molding.

The foregoing problem of warpage is particularly evident in TFBGA (Thin Fine-pitch Ball Grid Array) substrate, in which case the warpage could be up to 50 $\mu$m to 70 $\mu$m that would adversely affect the die-mounting process.

SUMMARY OF THE INVENTION

It is therefore an objective of this invention to provide a warpage-preventive circuit board and method for fabricating, the same which can help prevent the substrate to be subjected to warpage during the fabrication process so that semiconductor chip can be smoothly mounted on the substrate without being cracked due to warpage in substrate to allow the finished BGA package to be more assured in quality.

The semiconductor packaging technology according to the invention provides a circuit board comprising: an electrically-insulative core layer; a plurality of electrically-conductive traces, which are provided over one surface of the electrically-insulative core layer; a plurality of partitioned non-contiguous dummy circuit regions, which are provided over the electrically-insulative core layer in areas beyond the electrically-conductive traces, with a seam structure being left between each pair of neighboring dummy circuit regions; and an electrically-insulative layer, which is coated over the electrically-insulative core layer to cover the electrically-conductive traces and the dummy circuit regions.

The semiconductor packaging technology according to the invention is characterized by the provision of a plurality of partitioned non-contiguous dummy circuit regions beyond the areas where the electrically-conductive traces are provided, with a seam structure being left between each pair of neighboring dummy circuit regions, whereby when the dummy circuit regions are subjected to thermal expansion the existence of the seam structure therebetween can help buffer the thermal expansion, thus preventing warpage. This feature can help prevent the substrate to be subjected to warpage during the fabrication process so that semiconductor chip can be smoothly mounted on the substrate without being cracked due to warpage in substrate to allow the finished BGA package to be more assured in quality.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The warpage-preventive circuit board and method for fabricating the same according to the invention is disclosed in full details by way of preferred embodiments in the following with reference to FIG. 3 through FIG. 5. Note that FIG. 3 through FIG. 5 are simplified schematic diagrams to show only those parts related to the invention; and the shown parts are not drawn to actual scale, size, and number, which can be arbitrary design choices in the actual implementation of the invention.

Figure 1A:
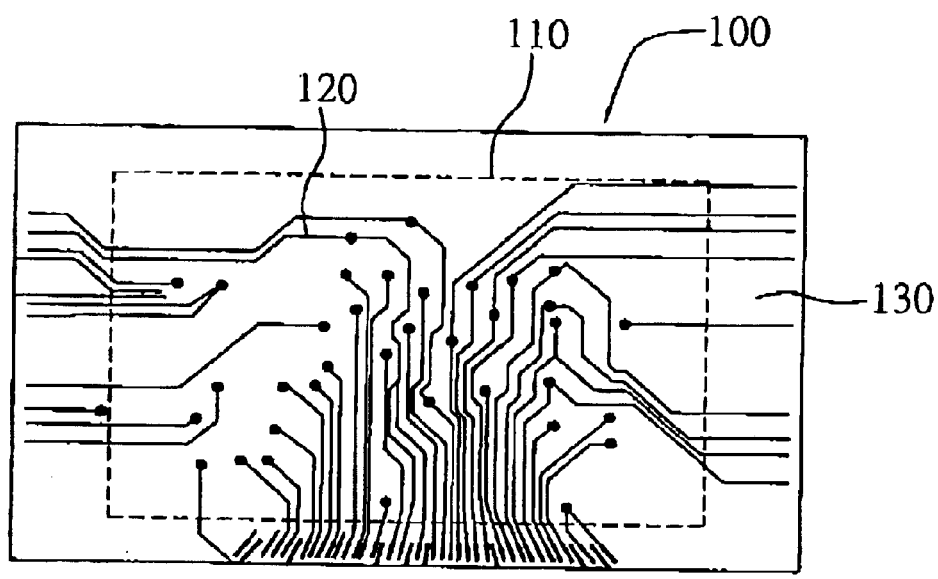
FIG. 1A (PRIOR ART) is a schematic diagram showing a top view of the layout of traces on a convention substrate.
Figure 1B:
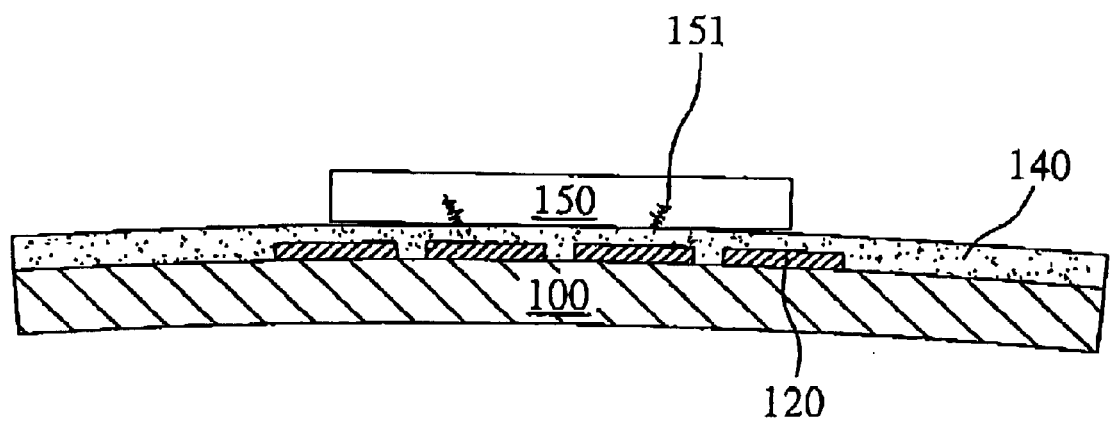
FIG. 1B (PRIOR ART) is a schematic diagram showing a sectional view of a package structure constructed on the substrate of FIG. 1A when the mounted chip cracks due to warpage in the substrate.
Figure 2:
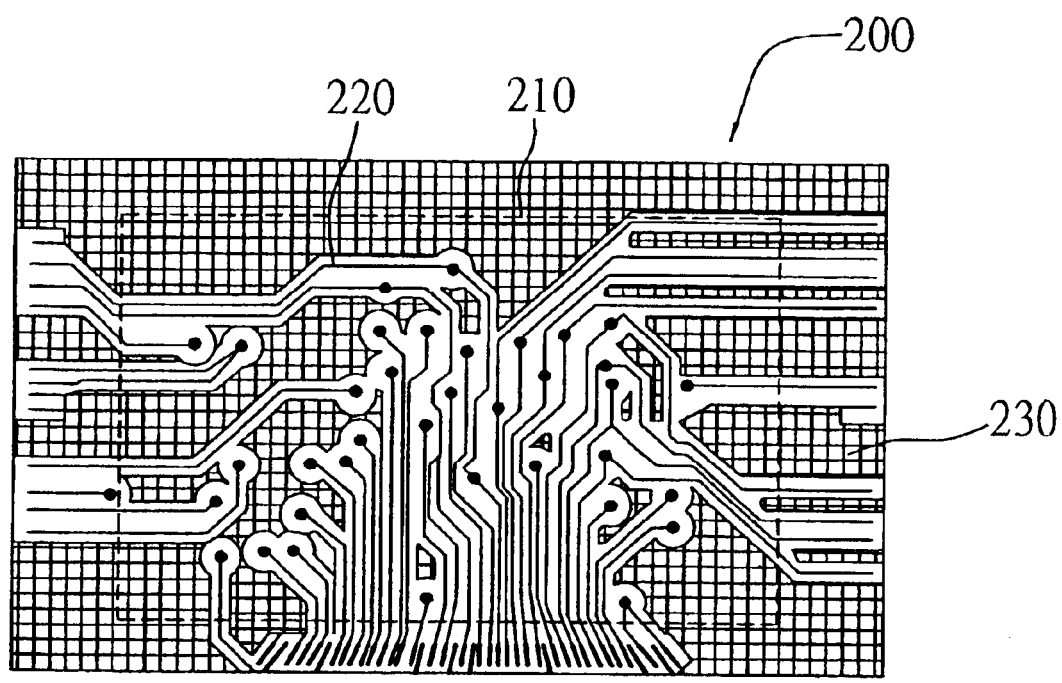
FIG. 2 (PRIOR ART) is a schematic diagram showing a top view of a substrate which is provided with dummy circuit regions.
Figure 3:
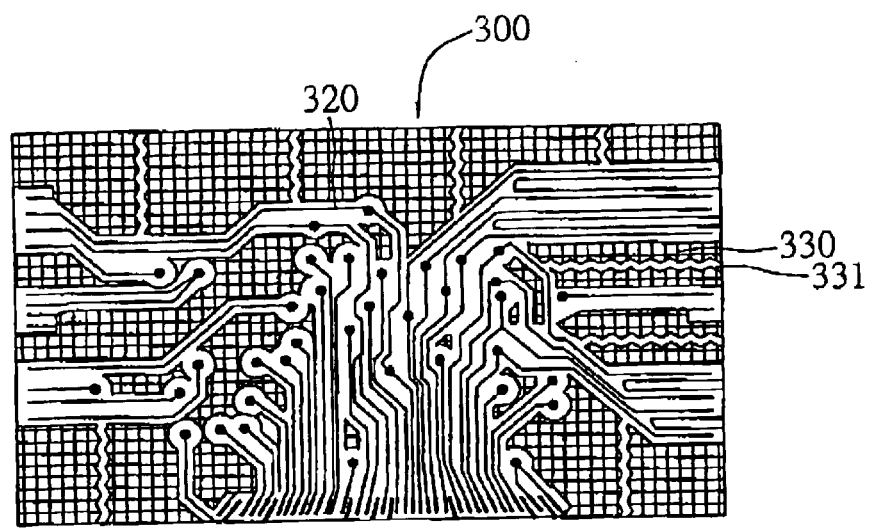
FIG. 3 is a schematic diagram showing a top view of the warpage-preventive circuit board with dummy circuit regions according to the invention.
Figure 4:
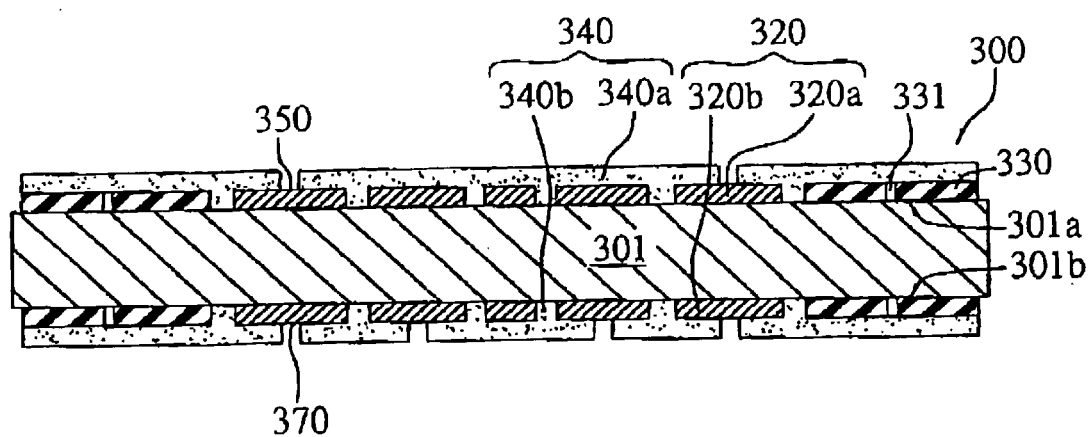
FIG 4 is a schematic diagram showing a sectional view of the warpage-preventive circuit board with dummy circuit regions according to the invention.
Figure 5:
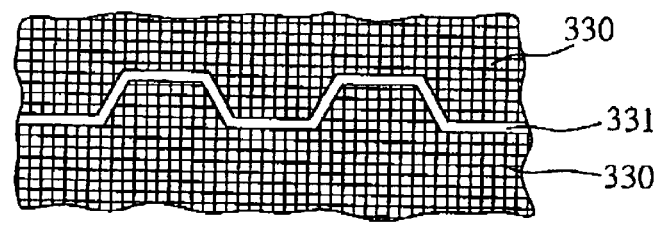
FIG. 5 is a schematic diagram showing the seam structure between the dummy electrically-conductive trace in the warpage-preventive circuit board of the invention.

Referring to FIG. 3 and FIG. 4, the warpage-preventive circuit board of the invention 300 comprises: an electrically-insulative core layer 301; a plurality of electrically-conductive trace 320, which is formed over one surface of the electrically-insulative core layer 301; a plurality of partitioned non-contiguous dummy circuit regions 330 provided over the area beyond the electrically-conductive trace 320, with each pair of neighboring dummy circuit regions 330 being provided with a wave-like seam structure 331 therebetween; and an electrically-insulative layer 340 coated over the electrically-insulative core layer 301 to cover the electrically-conductive trace 320 and the dummy circuit regions 330.

The warpage-preventive circuit board of the invention 300 is, for example, used for BGA package. The electrically-insulative core layer 301 is, for example, a layer made of resin, such as epoxy resin, polyimide, bismaleimide trazine (BT), FR4, and the like. The electrically-insulative core layer 301 has a first surface 301a and a second surface 301b, both of which are laminated with at least one copper layer, and the copper layer is selectively removed based on a predefined pattern through exposing, developing and etching to form a plurality of electrically-conductive trace 320a, 320b. Further, the first surface 301a is provided with a die-mounting area for mounting at least one semiconductor chip (not shown) thereon, while the second surface 301b is implanted with electrically-conductive means, such as an array of solder balls (not shown) for external electrical connection.

The partitioned non-contiguous dummy circuit regions 330 are arranged over the first surface 301a and the second surface 301b in those areas beyond the range of the electrically-conductive trace 320a, 320b, with a wave-like seam structure 331 being left between each pair of neighboring dummy circuit regions 330. The dummy circuit regions 330 are each dimensioned in such a manner as to be less than an empirically-determined warpage threshold size that is predetermined through experiments. If any one of the dummy circuit regions 330 is greater in size than this warpage threshold size, it would cause the substrate to be subjected to an unacceptable level of warpage; and if smaller in size than this warpage threshold size, it would not cause the substrate to be subjected to warpage. FIG. 5 shows another method to implement the seam structure 331, where the seam structure 331 is designed in a zigzag shape extending between each neighboring pair of the dummy circuit regions 330. When the dummy circuit regions 330 are subjected to thermal expansion, the existence of the seam structure 331 therebetween can help buffer the thermal expansion, thus preventing warpage.

The electrically-insulative layer 340 can be, for example, solder masks 340a, 340b coated respectively over the first surface 301a and the second surface 301b of the electrically-insulative core layer 301, to cover the electrically-conductive trace 320a, 322b and the dummy circuit regions 330, while exposing the finger portions 350 of the first electrically-conductive trace 320a and the solder pads 370 on the second electrically-conductive trace 320b. Since the solder masks 340a, 340b are coated over the electrically-conductive trace 320a, 320b, it serves as a protective shield against moisture or pollutants and can also prevent short circuit in the electrically-conductive trace 320a, 320b in subsequent processes.

In the fabrication process, the first step is to laminate a copper layer over the first surface 301a and the second surface 301b of the core layer, and then, the copper layers are selectively removed based on a predefined pattern through exposing, developing, and etching to form a plurality of electrically-conductive trace 320a, 320b and a plurality of partitioned non-contiguous dummy circuit regions 330 in areas beyond the electrically-conductive trace 320, with a wave-like seam structure 331 being left between each pair of neighboring dummy circuit regions 330.

Subsequently, solder masks 340a, 340b are coated respectively over the first surface 301a and the second surface 301b of the electrically-insulative, core layer 301 to cover the electrically-conductive trace 320a, 320b and the dummy circuit regions 330, while exposing the finger portions 350 of the first electrically-conductive trace 320a and the solder pads 370 on the second electrically-conductive trace 320b.

Figure 6:
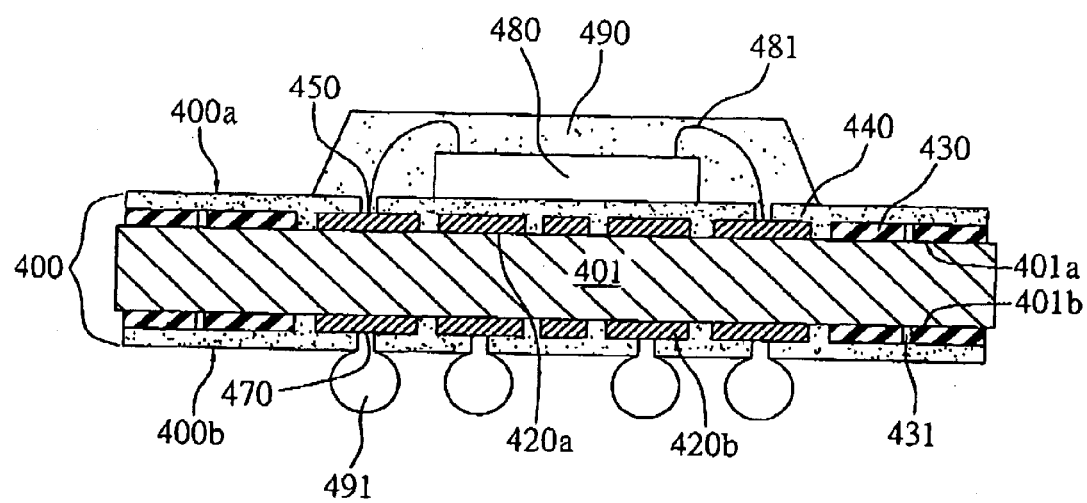
FIG. 6 is a schematic diagram showing the utilization of the warpage-preventive circuit board on a BGA package.

Referring to FIG. 6, the invention can be utilized in a BGA packaging process. In this process, the first step is to prepare a substrate 400 having a die-mounting surface 400a and an opposite ball-implantation surface 400b, wherein the die-mounting surface 400a corresponds to the first surface 401a of the core layer 401 while the ball-implantation surface 400b corresponds to the second surface 401b of the core layer 401.

In the next step, a die-mounting process is performed to mount at least one semiconductor chip 480 on the die-mounting surface 400a of the substrate 400; and subsequently, a wire-bonding process is performed to apply a set of bonding wires 481, such as gold wires, to electrically connect the I/O pads on the chip 480 to the exposed finger portions 450 of the first electrically-conductive trace 420a that are uncovered by the electrically-insulative layer 440.

In the next step, a molding process is performed to form an encapsulant 490 over the die-mounting surface 400a of the substrate 400 by the use of a resin material such as epoxy resin, for the purpose of encapsulating the chip 480 and the bonding wires 481 for protection against moisture and pollutants.

Subsequently, a PMC (Post Molding Curing, PMC) process is performed to cure the encapsulant 490 over the die-mounting surface 400a of the substrate 400 at a temperature of about 175□ for a period of about 6 hours.

Finally, a ball-implantation process is performed to implant a plurality of solder balls 491 on the solder pads 470 on the second electrically-conductive trace 420b that are uncovered by the electrically-insulative layer 440. These solder balls 491 allow the finished BGA package to be electrically connectable to an external printed circuit board (not shown).

During, the forgoing high-temperature processes, including curing, reflow, and molding, the high temperature would cause the dummy circuit regions 430 to expand. However, since these dummy circuit regions 430 are dimensioned to be smaller in size than an empirically-determined warpage threshold size that is predetermined through experiments, the thermal expansion thereof would not cause the substrate 400 to be subjected to warpage that would otherwise make the die-mounting process difficult to carry out. Moreover, with the provision of the seam structure 431, the thermal expansion of the dummy circuit regions 430 can be buffered and therefore would not cause warpage to the dummy circuit regions 430.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A warpage-preventive circuit board, which comprises:

an electrically-insulative core layer;

a plurality of electrically-conductive traces, which are provided over one surface of the electrically-insulative core layer;

a plurality of partitioned non-contiguous dummy circuit regions, which are provided over the electrically-insulative core layer in areas beyond the electrically-conductive traces, with a wave-like shaped scam structure being left between each pair of neighboring dummy circuit regions; and an electrically-insulative layer, which is coated over the electrically-insulative core layer to cover the electrically conductive traces and the dummy circuit regions.

2. The warpage-preventive circuit board of claim 1, wherein the dummy circuit regions are formed from copper.

3. The warpage-preventive circuit board of claim 1, wherein the circuit board is a BGA (Ball Grid Array) substrate.

4. The warpage-preventive circuit board of claim 1, wherein the electrically-insulative layer is a solder mask.

* * * * *